United States Patent [19]

Roush

[11] 3,865,183

[45] Feb. 11, 1975

[54] COOLING SYSTEMS FOR ELECTRONIC MODULES

[75] Inventor: Maurice D. Roush, Chippewa Falls, Wis.

[73] Assignee: Control Data Corporation, Minneapolis, Minn.

[22] Filed: Oct. 23, 1973

[21] Appl. No.: 408,887

[52] U.S. Cl. ..................... 165/80, 165/53, 317/100, 317/234 A

[51] Int. Cl. ............................................ F28f 7/00

[58] Field of Search ..... 165/80, 53; 317/100, 234 A

[56] References Cited

UNITED STATES PATENTS

| | | | |
|---|---|---|---|
| 3,229,756 | 1/1966 | Keresztury | 165/80 |
| 3,327,776 | 6/1967 | Butt | 317/100 |
| 3,334,684 | 8/1967 | Roush | 165/80 |
| 3,566,958 | 3/1971 | Zelina | 165/80 |

*Primary Examiner*—Manuel A. Antonakas
*Assistant Examiner*—Daniel J. O'Connor
*Attorney, Agent, or Firm*—Robert M. Angus

[57] ABSTRACT

An electronic circuit module is housed in a thermally conductive housing having fluid conduits therein for carrying coolant. The circuit module includes a stack of a plurality of circuit boards supported in the housing, each circuit board having a thermally conductive member attached to opposite side portions thereof, each member having a sawtooth edge portion. A cooling bar is sandwiched between a wall of the housing and the side members of the stack, and includes a surface adapted to abut the inner surface of the wall and a sawtooth portion of each member. Torque means, such as a threaded fastener, is provided for moving the cooling bar to wedge the same between the members and the wall to establish good thermal connection between the coolant in the fluid conduits and the circuit boards.

14 Claims, 5 Drawing Figures

COOLING SYSTEMS FOR ELECTRONIC MODULES

This invention relates to circuit module assemblies, and particularly to apparatus for cooling circuit boards of a circuit module assembly.

A circuit element (for example, a resistor, capacitor, or semiconductive device, or the like) dissipates power during operation, thereby generating heat. Prior to about 1940, the heat dissipated from electronic elements was not a significant problem due to the relatively low density of circuit packaging. However, as the state of the electronics are advanced, circuit packaging became more dense and a need developed for inclusion of cooling apparatus for dissipating heat generated by power dissipation. Early examples of such cooling techniques included simple ventilation apertures in housings and/or chassis to allow the free flow of ambient air around the circuit elements. However, as the density of circuit modules further increased, the requirement for more advanced cooling techniques likewise increased. Thus, computer modules of the late 1940's and early 1950's included suitable ventilation apparatus, such as fans, blowers and the like, to circulate ambient air through the circuit modules to thereby cool the same by forced air convection.

As the state of the electronic packaging art advanced, greater need arose for more adequate and sophisticated cooling techniques for cooling circuit modules of more densely packaged circuits. For example, U.S. Letters Pat. No. 3,334,684 granted Aug. 8, 1967 to Maurice D. Roush, et al., for "Cooling System For Data Processing Equipment," describes a cooling system for circuit modules utilizing a coolant or refrigerant circulated adjacent the modules to transfer heat therefrom by conduction and convection, the coolant being circulated through a refrigeration system.

One problem associated with cooling techniques for circuit modules has resided in the fact that circuit modules ordinarily comprise a plurality of circuit boards which must be cooled. Although numerous approaches have been advanced for cooling individual circuit boards of circuit modules, none have been completely effective in meeting current requirements of circuit density and heat dissipation.

It is an object of the present invention to provide cooling apparatus for a circuit module which exhibits more efficient heat transfer characteristics between the coolant and the individual circuit boards of the module.

It is another object of the present invention to provide a cooling system for a circuit module wherein each circuit board of the module is held rigidly contiguous a cooling medium.

It is yet another object of the present invention to provide a cooling technique which utilizes cooling bars adapted to be snuggly fitted between circuit boards and a housing carrying coolant so as to provide efficient heat transfer characteristics between the coolant and the circuit boards, thereby cooling the boards.

In accordance with the present invention, a circuit module includes a housing, or chassis, having fluid conduit means disposed therein for carrying coolant. A plurality of individual circuit boards are stacked within the housing, each having a thermally conductive member attached to the opposite edges thereof, the member having at least one nominal edge of irregular shape, such as a sawtooth edge. A cooling bar is positioned within the housing and has a surface of irregular shape adapted to engage the irregular, or sawtooth, surface of the heat conductive members, and torque means is provided for engaging the cooling bars to wedge the same between the thermally conductive members and the housing.

In accordance with one feature of the present invention, the irregular shapes of the cooling bar and the heat conductive members are generally sawtoothed so as to define heat transfer interface surfaces therebetween disposed at an angle to a nominal surface of the irregular edge, and the torque means includes a fastener or the like, adapted to bias the heat conductive bars to sandwich or wedge them between the housing and circuit boards.

In accordance with yet another feature of the present invention, the stack of circuit boards are rigidly fastened to, and sandwiched between, opposite plates forming the top and bottom walls of the housing, with the cooling bars loosely coupled thereto. The assemblage is thereafter assembled to the remaining portions of the housing, with at least one wall (e.g., the front wall) being preferably fastened to the top and bottom walls of the housing. The torque means is thereafter fastened to the conductive bars inside the housing to draw the bars forwardly in the housing to wedge the bars between the wide walls of the housing and the thermally conductive members of the circuit boards.

The above and other features of this invention will be more fully understood from the following detailed description and the accompanying drawings, in which.

Figure 1:
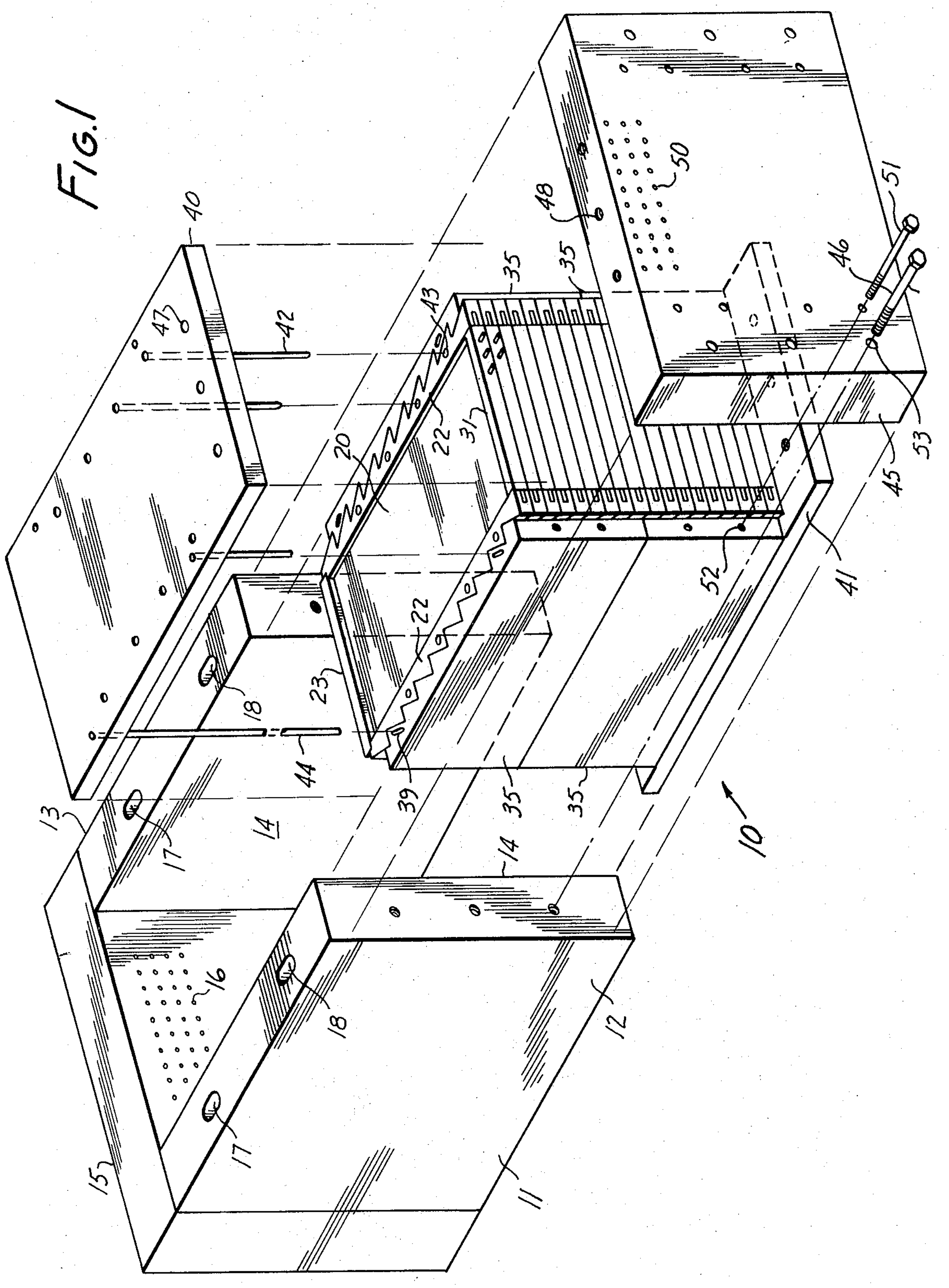
FIG. 1 is a exploded perspective view of a circuit module in accordance with the presently preferred embodiment of the present invention.

Referring to the drawings, there is illustrated a circuit module 10 comprising a housing 11 having opposite side walls 12 and 13. Each wall 12, 13 includes substantially planar inner surface 14. The rear of housing 11 is closed by a suitable plate 15 fastened to walls 12 and 13, and having a suitable receptical 16 therein.

Fluid conduits 17,18 are formed in each wall 12, 13 and are disposed through the height thereof to carry a suitable coolant, such as Freon. As will be understood to those familiar with the refrigeration art, fluid conduits 17 and 18 terminate at suitable manifolds (not shown) for connection to a suitable refrigeration system (not shown). For example, such a refrigeration system may include a heat exchanger, condenser and compressor, as more fully explained in the aforementioned Roush, et al., patent.

Figures 2, 3, 4, 5:
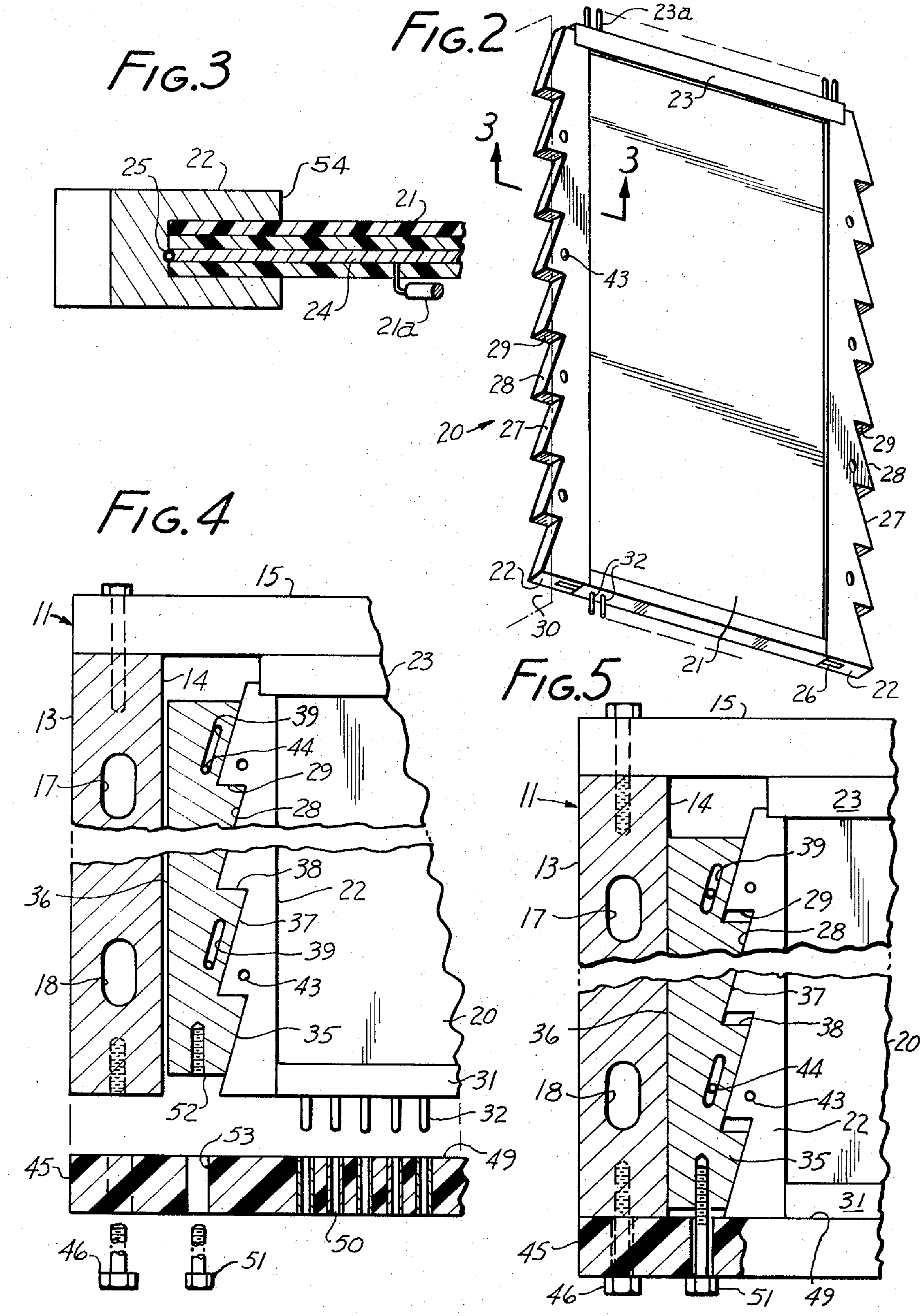
FIG. 2 is a perspective view of a typical circuit board for use in the apparatus illustrated in FIG. 1.
FIG. 3 is a section view taken along line 3—3 in FIG. 2.
FIG. 4 is a section view of a portion of the apparatus illustrated in FIG. 1.
FIG. 5 is a section view, as in FIG. 4, showing the apparatus fully assembled.

Referring to FIGS. 2 and 3, a plurality of circuit cards 20 each comprise a substantially planar substrate 21 whose edges are nested in and fastened to thermally conductive members 22. A rear edge of each circuit board 20 terminates in a connector 23 adapted to engage and mate with respective connector recepticals 16 in plate 15. For example, the individual contacts **23*a* of connector 23 are electrically connected to suitable circuit elements 21*a* mounted to substrate 21. Preferably, the front edge of each circuit card also terminates in a connector 31 having individual contacts 32 electrically connected to selected circuit elements 21***a*.

Each substrate 21 may comprise a multilayer circuit board. Conveniently, one layer 24 of the circuit board may be constructed of a suitable thermally conductive material to form an electrical ground plane for the circuit board. Layer 24 may be thermally attached to member 22 by solder 25 or other suitable thermal connection to form a cold plate within each circuit board.

As shown particularly in FIG. 2, member 22 is slotted at 26 to receive substrate 21, and includes a plurality of sawtooth portions 27, each having a first edge surface 28 disposed at a predetermined angle to the length of member 22 and a second edge surface 29 forming a transition between adjacent surfaces 28 and normal to the nominal edge plane 30, which is parallel to the length of member 22.

Cooling bars or spacers 35 are positioned adjacent members 22. Each cooling bar 23 includes a first planar surface 36 disposed parallel to nominal plane 30, and a such sawtooth portion including first surface portions 37 and disposed at a predetermined angle to nominal plane 30 and a second edge surface portion 38 disposed normal to plane 30 to form transitions between adjacent surfaces 37. The sawtooth edge portion formed by surfaces 37 and 38 closely conform to the sawtooth edge portions formed by edge portions 28 and 29 of member 22. For example, the edge portions 28 and 37 disposed at an angle to plane 30 may be disposed at 15° to plane 30 to assure a tight abutment fit as will be more fully understood hereinafter. Preferably, members 35 include elongated slotted portions 39 disposed at substantially the same angle to plane 30 as portions 37 and 28.

Initially, a plurality , for example eighteen circuit boards are stacked as shown in FIG. 1 so that members 22 are contiguous to each other along their respective upper and lower surfaces. Upper and lower plates 40 and 41, respectively, sandwich the stack, and fasteners 42 extend through apertures 43 of the members 20 and are fastened to plates 40 and 41, thereby rigidly holding the assemblage together. Cooling bars 35 are positioned adjacent the edges of the stack of cards formed by the sawtooth portion of members 22, and pins 44 extend through slots 39 and are fastened to plates 40 and 41, thereby loosely coupling the cooling spacer bars to the assemblage. For example, each cooling bar 35 may engage the edges of several members 22, such as nine such members as shown in FIG. 1. It should be recognized that the cooling bars 35 are loosely coupled to the assemblage and are capable of moving in a direction dictated by the direction and length of slots 39.

The assemblage is thereafter positioned in the U-shaped portion of housing 11 formed by walls 12, 13 and 15 so that connectors 23 engage respective connector recepticals 16. Thereafter, face plate 45 is fastened to side wall members 12 and 13 by suitable fasteners 46 and to the upper and lower plates 40 and 41 by fasteners (not shown) assembled to recepticals 47 and 48. The finally assembled arrangement is such that the forward of edge of members 22 abut surface 49 of plate 45 so as to fixedly position the circuit boards within the housing and to maintain the connection between the contacts on the printed circuit boards and the contacts of connector 16. As shown particularly in FIGS. 1 and 4, face plate 45 includes a plurality of electrical connectors 50 adapted to engage contacts 32 of connectors 31. Connectors 50, for example, may provide suitable test point connectors for each module.

The threaded portions of fasteners 51 are threadably engaged to threaded portions 52 of cooling bars 35 through apertures 53 of face plate 45. The heads of fasteners 51 bear against the surface of face plate 45 so that upon axial rotation of fasteners 51, cooling spacer bars 35 are moved axially thereby causing the spacer bars to be wedged between surfaces 14 of walls 12 and 13 and surfaces 28 of members 22. By applying a sufficient torquing force to fasteners 51, for example 20 lbs. of torque, cold bars 35 are tightly wedged between members 22 and walls 12 and 13 thereby providing adequate thermal connection between the members so as to cool members 22 by conduction.

As fasteners 51 are axially rotated to tighten the position of cooling bar 35 between the members, the cooling bar physically moves from the position illustrated in FIG. 4 to that illustrated in FIG. 5 wherein a tight abutment fit is established between surfaces 36 of the cold plate and surface 14 of the housing and between surfaces 37 of the cold plate and surfaces 28 of member 22. The application of the torque force to each fastener 51 assures a tight wedging fit between walls 11, 12 and members 22. The tight abutment fit of cold plate 35 between the members assures adequate thermal connection between the members.

It should be noted that surfaces 28 and 37 of member 22 and cooling bar 35 are disposed at substantially the same angle to surfaces 14 and 36 of wall 12, 13 and bar 35. Thus, surfaces 37 and 36 form a sectioned "wedge" shaped cooling bar between wall 12, 13 and member 22.

It should be noted that the truncated shape of the sawtoothed cooling bars are tapered such that drawing the cooling bars forward toward face plate 35 causes the side surfaces of the cooling bar to tightly engage respective surfaces of wall 12, 13 and members 22. By applying a suitable torque to fasteners 51, for example, 20 pounds torque, a suitable lateral force is applied to the sawtooth surfaces to wedge bar 35 into a tight, heat conducting connection between circuit boards 20 and walls 12 and 13 carrying the coolant.

Since members 22 are thermally connected to the ground plane of the printed circuit board, a temperature gradiant is established between the coolant flowing in conduits 17 and 18 and the circuit elements on the circuit boards to cool the circuit elements and the boards. Furthermore, the raised lips 54 of member 22 together form a cold barrier wall enclosing cavities between each circuit board so as to cool the cavities by convection.

In a typical application of the present invention, a plurality of circuit boards 21 will be stacked in a single module between cold plates 35. For example, and illusttrated particularly in FIG. 1, a module may contain 18 circuit boards comprising two stacks of nine circuit cards each, each stack being disposed between two cold plates. Additionally, the circuit boards may be electrically and thermally interconnected as is more fully described in the co-pending application of Seymour R. Cray and Maurice D. Roush, Ser. No. 339,673 filed Mar. 9, 1973 for "Interconnect Technique For Stacked Circuit Boards,"now U.S. Pat. No. 3,832,603 granted Aug. 24, 1974, and assigned to the same assignee as the present invention. Such an arrangement is particularly useful for computer modules such as logic apparatus, amplifiers, registers, and the like.

The present invention provides a thermal connection for cooling stacked circuit boards in relatively high density to enable adequate cooling of circuit elements of such circuit boards. The apparatus provides more efficient cooling than theretofore provided by prior techniques.

This invention is not to be limited by the embodiment shown in the drawings and described in the description, which is given by way of example and not of limitation, but only in accordance with the scope of the appended claims.

What is claimed is:

1. An electronic circuit module comprising:

a thermally conductive housing supporting a stack of a plurality of substantially planar circuit boards, said housing including side wall members defining internal surfaces; fluid conduit means disposed in said wall members for containing coolant;

thermally conductive spacer means including a first surface adapted to bear against a respective internal surface and a sawtooth edge portion having surface portions disposed at a predetermined angle to said first surface;

a thermally conductive edge member mounted to opposite side portions of each of said circuit boards each edge member having a sawtooth edge portion defining a nominal edge plane of said board, such nominal edge plane being disposed substantially parallel to said internal surface of the respective side wall member, the sawtooth edge portion of each edge member including first surface portions disposed at a predetermined angle to said nominal plane and second edge portions forming transitions between adjacent first edge portions; and torque means engaging said conductive spacer means to move said conductive spacer means at said predetermined angle to the length of said nominal plane to wedge said conductive spacer means between said respective wall member and the respective conductive edge members of said stack of circuit boards.

2. Apparatus according to claim 1, wherein said housing includes a face plate mounted to said wall members, a forward portion of each of said circuit boards bearing against said face plate.

3. Apparatus according to claim 2, wherein said torque means comprises threaded fastener means having a head portion adapted to engage said face plate and a threaded portion threadably engaged to said conductive spacer means to move said conductive spacer means along the axis of said fastener means.

4. Apparatus according to claim 1, wherein each of said circuit boards includes a ground plane thermally connected to its respective conductive edge members.

5. Apparatus according to claim 4, wherein said housing includes a face plate mounted to said wall members, a forward portion of each of said circuit boards bearing against said face plate.

6. Apparatus according to claim 5, wherein said torque means comprises threaded fastener means having a head portion adapted to engage said face plate and a threaded portion threadably engaged to said conductive spacer means to move said conductive spacer means along the axis of said fastener means.

7. Apparatus according to claim 1, wherein said conductive edge members each include a portion extending above and below the surface of the respective circuit board, said conductive edge members being stacked in contiguous relation to form cavities between respective circuit boards bounded by said portions of adjacent conductive edge members.

8. Apparatus according to claim 7, wherein said housing includes a face plate mounted to said wall members, a forward portion of each of said circuit boards bearing against said face plate.

9. Apparatus according to claim 8, wherein said torque means comprises threaded fastener means having a head portion adapted to engage said face plate and a threaded portion threadably engaged to said conductive spacer means to move said conductive spacer means along the axis of said fastener means.

10. Apparatus according to claim 7, wherein each of said circuit boards includes a ground plane thermally connected to its respective conductive edge members.

11. An electronic circuit module comprising:

a plurality of substantially planar circuit boards;

thermally conductive edge means mounted to opposite side portions of each circuit board, each thermally conductive edge means having a sawtooth edge portion extending nominally parallel to the length of the respective circuit board, each of said sawtooth edge portions including surface portions disposed at a predetermined angle to the length of the respective circuit board;

mounting means rigidly fastening said circuit boards together in stacked relation so that the sawtooth edge portions of said thermally conductive edge means of said circuit boards together form a sawtooth edge plane along opposite sides of such stack of circuit boards;

thermally conductive spacer means loosely coupled adjacent respective sawtooth edge planes of said stack of circuit boards, said spacer means having a sawtooth surface portion so disposed and arranged as to bear against the respective sawtooth edge plane of said stack, and a substantially planar surface extending substantially parallel to the length of said circuit boards;

a thermally conductive housing supporting said stack therein, said housing having opposite wall members defining substantially planar inner surfaces;

fluid conduit means disposed in said wall members for carrying coolant;

and torque means engaging said conductive spacer means to move said spacer means in a direction at said predetermined angle to the length of said circuit boards to wedge said spacer means between the respective inner surfaces of said wall members and the respective edge members of said circuit boards.

12. Apparatus according to claim 11, wherein said housing includes a face plate mounted to said wall members, said torque means including threaded fastener means having a threaded portion engaged to said spacer means and a head portion adapted to bear against said face plate.

13. Apparatus according to claim 12, wherein each of said circuit boards includes a ground plane thermally connected to its respective conductive edge members.

14. Apparatus according to claim 11, wherein each of said circuit boards includes a ground plane thermally connected to its respective conductive edge members.

* * * * *